United States Patent [19]

Khayat

[11] Patent Number: 5,532,626

[45] Date of Patent: Jul. 2, 1996

[54] OFF-LINE CONTROLLER HAVING A LINE VOLTAGE DETECTOR AND A SWITCHED CURRENT BOOTSTRAP CIRCUIT

[75] Inventor: Joseph M. Khayat, Bedford, N.H.

[73] Assignee: Unitrode Corporation, Billerica, Mass.

[21] Appl. No.: 384,769

[22] Filed: Feb. 6, 1995

[51] Int. Cl.⁶ .................................................. G01R 19/00
[52] U.S. Cl. ........................... 327/53; 327/338; 327/66; 323/282; 363/21
[58] Field of Search ............................. 363/21; 323/282, 323/284; 327/53, 66, 312, 323, 332, 266, 280, 58, 68, 69, 538, 540, 403

[56] References Cited

U.S. PATENT DOCUMENTS

| | | | |
|---|---|---|---|
| 3,942,102 | 3/1976 | Kuhn et al. | 324/16 R |
| 4,251,743 | 2/1981 | Hareyama | 327/538 |
| 4,331,888 | 5/1982 | Yamauchi | 32/68 |
| 4,473,759 | 9/1984 | Mahabadi | 327/68 |
| 5,028,861 | 7/1991 | Pace et al. | 323/284 |
| 5,079,453 | 1/1992 | Tisinger et al. | 307/491 |
| 5,245,526 | 9/1993 | Balakrishnan et al. | 363/97 |
| 5,428,287 | 6/1995 | Agiman | 323/284 |

Primary Examiner—John S. Heyman
Assistant Examiner—Jung Kim
Attorney, Agent, or Firm—Weingarten, Schurgin, Gagnebin & Hayes

[57] ABSTRACT

An off-line controller circuit having a line voltage detector and a switched current bootstrap circuit. The controller receives current from the line and provides a drive signal for controlling the switch(es) of an off-line converter. The line voltage detector establishes a voltage proportional to the line voltage in response to a portion of the received line current. The proportional voltage is compared to a reference voltage to provide a control signal for inhibiting the drive signal when the proportional voltage is less than the reference voltage, indicating that the line voltage is less than a predetermined level. The switched current bootstrap circuit limits a bootstrap current provided to the controller supply voltage from the converter output in accordance with current shunted to ground by a supply voltage clamp. A switched current source is provided for sensing the current through the clamp and limiting the bootstrap current flow from the converter output to the supply voltage as a function of the sensed current.

12 Claims, 3 Drawing Sheets

OFF-LINE CONTROLLER HAVING A LINE VOLTAGE DETECTOR AND A SWITCHED CURRENT BOOTSTRAP CIRCUIT

FIELD OF THE INVENTION

This invention relates generally to off-line controller circuits and, more specifically, to an off-line controller circuit that includes a line voltage detector and a switched current bootstrap circuit.

BACKGROUND OF THE INVENTION

Off-line controller integrated circuits for providing the drive signal(s) for the switching device(s) of an off-line converter are known. The off-line converter converts an unregulated DC voltage, such as may be provided by rectifying an AC line voltage, into a regulated DC output voltage. In general, off-line controllers include circuitry for comparing a feedback signal representative of the converter output with a reference signal in order to generate the drive signal(s) for the converter switching device(s). The drive signal(s) adjust the duty cycle of the switch(es) in response to the feedback signal in order to regulate the converter output voltage to a predetermined level. The feedback signal may be the DC output voltage, the output current, or some signal proportional to the output voltage or current and/or transformer isolated from the output.

Some off-line controllers include an undervoltage lockout feature, whereby the line voltage is sensed and the drive signal is inhibited (i.e., forced to a level necessary to keep the converter switching device(s) off) if the line voltage falls below a predetermined level. One way of implementing this feature is to provide a resistor divider, external to the controller, to establish a voltage proportional to the line voltage for comparison to a reference voltage. However, this arrangement requires that the controller include an additional pin for connection to the resistor divider for the purpose of sensing the line voltage.

Often, the controller circuitry is powered by the unregulated DC line voltage at start-up, until the regulated converter output voltage is within a specified range. Connection between the line voltage and the controller for this purpose may be achieved with a series resistor and capacitor arrangement, external to the controller, with the interconnection between the resistor and capacitor connected to a supply voltage, or $V_{CC}$, input pin of the controller and the capacitor further connected to ground. Once the converter output voltage rises to a predetermined level, an alternative mechanism provides the supply voltage $V_{CC}$ to the controller and maintains a predetermined charge on the external supply voltage capacitor, such as an additional secondary winding on the converter transformer. This alternative current for charging the supply voltage capacitor is sometimes referred to as a bootstrap current.

SUMMARY OF THE INVENTION

In accordance with the invention, an off-line controller receiving a line current includes a line voltage detector for sensing the level of the line voltage, without requiring an additional controller pin for the purpose of line voltage detection. The off-line controller includes control circuitry which receives the line current for a purpose other than line voltage detection. In one embodiment, the control circuitry includes an oscillator timing capacitor which sets the on-time (i.e., conduction time) of the converter switch(es). Alternatively, such control circuitry may be power factor correction circuitry used in combination with the line voltage detector.

The line voltage detector includes a current mirror having a first leg carrying the first portion of the line current received by the controller to the control circuitry and a second leg carrying a second portion of the line current to a sense resistor of the line voltage detector. The sense resistor establishes a voltage proportional to the line voltage for processing by a comparator, having a first input terminal receiving the proportional voltage and a second input terminal receiving a reference voltage. The comparator provides an output signal in a first logic state when the line voltage is greater than a predetermined level and in a second logic state (i.e., a line voltage fault state) when the line voltage is less than a predetermined level.

A delay circuit is connected to the output terminal of the comparator for delaying the transition of the comparator output signal from the second, line voltage fault state to the first state. The delay circuit ensures that the drive signal frequency does not exceed a predetermined frequency which is established by a line voltage greater than the predetermined level, so as to limit the converter switching frequency during a brownout, or low line condition.

In one embodiment, the line voltage detector receives: the second portion of line current only during certain operating intervals. Since the output signal of the comparator is indicative of the line voltage status only during those operating intervals when the line voltage detector receives the second portion of the line current, a switch is connected in series between the sense resistor and the first input terminal of the comparator. The switch is adapted for being in a first position to connect to the sense resistor to first input terminal of the comparator when the line voltage detector receives the second portion of line current (i.e., when the line current flows through the sense resistor) or in a second position to connect a supply voltage to the first comparator input terminal during the remaining operating intervals (i.e., when the line current ceases to flow through the sense resistor).

A diode is connected in series between the sense resistor and ground, with the anode connected to the sense resistor and the cathode connected to ground, in order to compensate for the effect of temperature variations on the sense resistor. The diode has a temperature coefficient substantially identical but opposite in polarity with respect to that of the sense resistor so that, as the resistance of the sense resistor varies with temperature, the voltage across the diode varies to cancel the resulting voltage variation across the sense resistor attributable to the temperature variation.

In accordance with a further aspect of the invention, the off-line controller includes a switched current bootstrap circuit for limiting a bootstrap current provided to the controller supply voltage $V_{CC}$ in accordance with the level of current shunted to ground by a clamp connected across the supply voltage. More particularly, a supply voltage, or $V_{CC}$ pin of the controller has a bypass capacitor connected thereto. The supply voltage clamp prevents the supply voltage $V_{CC}$ from exceeding a predetermined clamp level by shunting current to ground when the supply voltage level exceeds the predetermined clamp level. A switched current source, coupled between the supply voltage and a bootstrap voltage source, such as the regulated converter output, permits a limited bootstrap current to flow from the bootstrap voltage source to the supply voltage pin or bypass capacitor when the supply voltage level is lower than the bootstrap voltage source level and terminates the bootstrap current when the supply voltage $V_{CC}$ level is greater than the bootstrap voltage source level. To this end, the switched current source senses the current through the clamp and limits the bootstrap current in response to the sensed current, such that the bootstrap current is decreased as the current shunted to ground by the clamp increases. With this arrangement, power dissipation caused by the supply of unnecessary bootstrap current is avoided.

BRIEF DESCRIPTION OF THE DRAWINGS

The above and further advantages of this invention may be better understood by referring to the following description taken in conjunction with the accompanying drawings, in which.

DESCRIPTION OF THE PREFERRED EMBODIMENT

Figure 1:
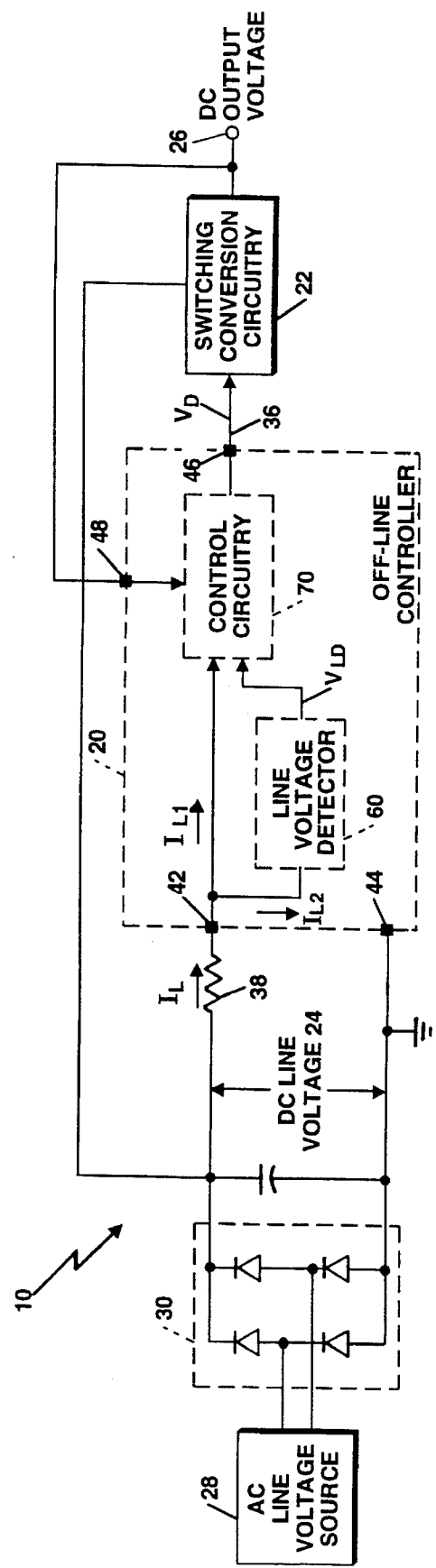
FIG. 1 is a block diagram of an off-line converter including an off-line controller circuit having a line voltage detector.

Referring to FIG. 1, an off-line converter 10 includes an off-line controller 20 and switching conversion circuitry 22. The converter 10 is a step-down converter, responsive to an unregulated DC line voltage 24 for providing a regulated DC output voltage $V_{OUT}$ 26. The DC line voltage 24 is generated from an AC line voltage source 28 through a conventional bridge, or rectifier circuit 30.

The switching conversion circuitry 22 may take the form of various topologies, such as the dual-flyback arrangement shown and described below in conjunction with in FIG. 2, and includes one or more devices for switching the DC line voltage 24 at a relatively high frequency and with a duty cycle controlled to provide and maintain a desired level of DC output voltage $V_{OUT}$ 26. The switching device(s) of the conversion circuitry 22 are controlled by corresponding drive signal(s) $V_D$ generated by the off-line controller 20.

The controller 20 is an integrated circuit (IC) having pads, or pins, for permitting external access and connections to internal circuitry. While controller 20 is shown to include pins 42, 44, 46 and 48 in FIG. 1, the controller IC 20 includes additional pins 50, 52, 54 and 56, as shown and described in conjunction with FIG. 2. It is advantageous to limit the number of pins necessary on the IC 20 in order to minimize the printed circuit board area occupied by the IC 20 and to permit use of a standard chip package.

The off-line controller 20 is responsive to the DC output voltage $V_{OUT}$ 26, which is fed back to the controller 20, as is conventional. In the present converter 10, the off-line controller 20 includes control circuitry 70 which is additionally responsive to the DC line voltage 24 and, more specifically, receives a first portion $I_{L1}$ of line current $I_L$ from the line 24 through a resistor 38. In the illustrative embodiment, the line current $I_L$ is provided to the control circuitry 70 for the purpose of implementing a control algorithm for deriving the drive signal $V_D$ which relies on the DC line voltage 24. The control algorithm provides an on-time (i.e., conduction time) of the conversion circuitry switching device(s) that is inversely proportional to the DC line voltage 24 and a switch off-time (i.e., non-conduction time) that is inversely proportional to the DC output voltage $V_{OUT}$ 26, as described in U.S. Pat. No. 5,730,405 entitled "CONTROL CIRCUIT FOR CONVERTERS OPERATING IN THE DISCONTINUOUS MODE", filed on Aug. 12, 1992, with inventor Isaac Cohen.

The controller 20 includes a line voltage detector 60 which receives a second portion $I_{L2}$ of the line current $I_L$ and provides a control signal $V_{LD}$ to control circuitry 70 indicative of whether the DC line voltage 24 is below a predetermined level. Control circuitry 70 generates the drive signal $V_D$ on line 36 for driving the switching device(s) of the conversion circuitry 22 in response to the DC output voltage $V_{OUT}$ 26 (or a voltage proportional thereto), the first line current portion $I_{L1}$, and the line voltage detector control signal $V_{LD}$.

Figure 2:
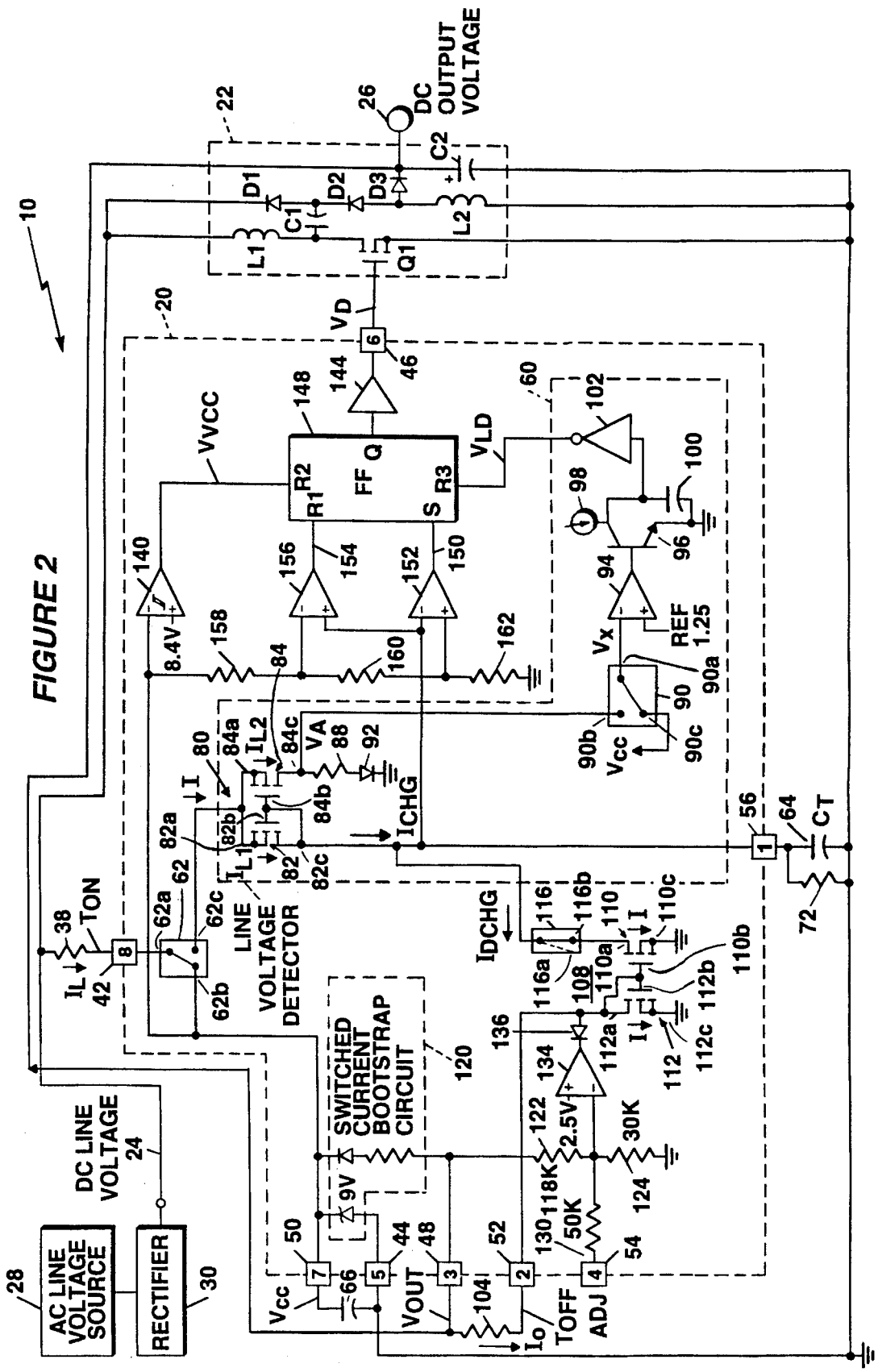
FIG. 2 is a schematic of the converter of FIG. 1 showing the off-line controller to include a switched current bootstrap circuit.

Referring also to FIG. 2, a schematic of the converter 10 includes the controller IC 20, the conversion circuitry 22 and the resistor 38 interconnecting the DC line voltage 24 and the controller 20. The controller IC 20 includes the line voltage detector 60 and the remainder of the controller circuitry provides the control circuitry 70 of FIG. 1.

In the illustrative embodiment, the conversion circuitry 22 includes a MOSFET switch Q1 and two flyback stages in a series configuration, as described in the above referenced U.S. Pat. No. 5,430,405. A first one of the flyback stages includes an inductor L1, a capacitor C1 and a diode D1 and the second flyback stage includes an inductor L2, a capacitor C2 and a diode D2.

In operation, the inductor L1 is switched across the DC line voltage 24 when the switching device Q1 is on. Energy is stored in inductor L1 as its current rises until the switch Q1 is turned off. At this time, inductor L1 discharges into capacitor C1 and diode D1 conducts. In steady state operation, a DC voltage is developed across capacitor C1. Inductor L2 is switched across the voltage of capacitor C1 when the switch Q1 is on. When the switch Q1 turns off, inductor L2 discharges into capacitor C2. The voltage across capacitor C2 provides the regulated DC output voltage $V_{OUT}$ 26, which is controlled by varying the duty cycle of switch Q1. The cascaded flyback converter 22 is operated in the discontinuous current mode as described in an Off-line Power Supply Controller Preliminary data sheet for the UCC1889, UCC2889 and UCC3889 controllers and in an application note U-149 entitled "Elegantly simple off-line bias supply for very low per applications", both of Unitrode Integrated Circuits Corporation and incorporated herein by reference.

In order to implement the control algorithm, the controller 20 includes a switch 62 having a first terminal 62a connected to a $T_{ON}$ pin 42 of the controller IC 20 and to external resistor 38, a second terminal 62b connected to a supply $V_{CC}$ pin 50, and a third terminal 62c connected to the line voltage detector 60. The $V_{CC}$ pin 50 is adapted for coupling to an external bypass capacitor 66 which is further coupled to a ground pin 44. In the illustrative embodiment, the supply voltage $V_{CC}$ has a nominal clamp voltage level of 9.0 volts. The line voltage detector 60 is further coupled to a $C_T$ pin 56, as shown, which is adapted for coupling to an external timing capacitor 64 and resistor 72.

At start up, switch 62 is positioned to connect terminals 62a and 62b and the $V_{CC}$ bypass capacitor 66 is charged by the line current $I_L$. Once the supply voltage $V_{CC}$ reaches a specified level, switch 62 toggles to connect terminals 62a and 62c, thereby causing a first portion $I_{L1}$ of the line current $I_L$ to charge capacitor 64 and a second position $I_{L2}$ of the line current to provide a voltage proportional to the line voltage 24 for detection by detector 60. Once the timing capacitor 64 is charged to a predetermined level as determined by a reset comparator 156, switch 62 toggles back to its initial position, in which the line current $I_L$ charges bypass capacitor 66. When the switch 62 is positioned to charge bypass capacitor 66, timing capacitor 64 is discharged. Once timing capacitor 64 is discharged to a second predetermined level as determined by a set comparator 152, switch 62 again toggles to connect terminals 62a and 62c. This toggling of switch 62 continues during operation as the bypass capacitor 66 and the timing capacitor 64 are alternatingly charged by the line current $I_L$. Thus, the line current $I_L$ charges $V_{CC}$ bypass capacitor 66 during a first portion of each switching cycle and charges the timing capacitor 64 during a second portion of each cycle. The portion of each cycle during which the $V_{CC}$ bypass capacitor 66 is charged corresponds to the portion of the cycle during which switch Q1 is open; whereas, the portion of the cycle during which the timing capacitor 64 is charged corresponds to the portion of the cycle during which the switch Q1 is closed.

The line voltage detector 60 includes a PMOS current mirror 80 having a first leg comprising a first PMOS transistor 82 in series between switch terminal 62c and $C_T$ pin 56 and a second leg comprising a second PMOS transistor 84 in series between switch terminal 62c and a sense resistor 88. More particularly, the first PMOS transistor 82 has a source terminal 82a connected to switch terminal 62c, a drain terminal 82c connected to $C_T$ pin 56 and timing capacitor 64 and a gate terminal 82b connected to drain terminal 82c and to a gate terminal 84b of the second PMOS transistor 84. The second PMOS transistor 84 has a source terminal 84a connected to switch terminal 62c, a gate terminal 84b connected to the gate terminal 82b of transistor 82 and a drain terminal 84c connected to sense resistor 88 and to a switch 90, as shown.

The line voltage detector 60 further includes a comparator 94 having an inverting input terminal adapted for connection to the sense resistor 88, a non-inverting input terminal receiving a reference voltage Vref and an output terminal. The comparator output terminal is connected to the base of an npn transistor 96 having an emitter connected to ground and a collector to which a current source 98, a capacitor 100 and an inverter 102 are connected, as shown. The inverter output terminal provides the control signal $V_{LD}$ indicative of whether the line voltage 24 is less than a predetermined level. If the control signal $V_{LD}$ indicates such a line voltage fault, the drive signal $V_D$ provided by the controller 20 to switch Q1 is inhibited, causing switch Q1 to open.

A diode 92 is connected in series between sense resistor 88 and ground, with the anode connected to sense resistor 88 and the cathode connected to ground. The diode 92 provides temperature compensation, by canceling the effect of temperature variations on the resistance of resistor 88. More particularly, the diode 92 has a temperature coefficient substantially identical and opposite in polarity with respect to that of resistor 88. In this way, temperature induced voltage variations across the sense resistor 88 and diode 92 tend to cancel each other.

The line current portion $I_{L2}$ that flows through FET 84 when switch 62 is positioned to charge timing capacitor 64 establishes a voltage $V_R$ across the sense resistor 88 and diode 92 that is proportional to the line voltage 24. In one embodiment, the second line current portion $I_{L2}$ is one-quarter of the level of the first line current portion $I_{L1}$. As is apparent, during operating intervals when the switch 62 is positioned to connect terminals 62a and 62b, the line current portion $I_{L2}$ ceases to flow. Thus, the line voltage detector 60 provides useful line voltage information only when switch 62 is positioned to connect terminals 62a and 62c. For this reason, a switch 90 is provided between sense resistor 88 and the inverting input terminal of comparator 94. Switch 90 has a first terminal 90a connected to the inverting input terminal of a comparator 94, a second terminal 90b connected to resistor 88 and a third terminal 90c connected to supply voltage $V_{CC}$.

Switch 90 is positioned to connect terminals 90a and 90b when switch 62 is positioned to connect terminals 62a and 62c and switch Q1 is closed; whereas, switch 90 is positioned to connect terminals 90a and 90c when switch 62 is positioned to connect terminals 62a and 62b and switch Q1 is open. With this arrangement, the voltage $V_R$ across the sense resistor 88 and diode 92 is coupled to the inverting input terminal of comparator 94 when the line current $I_L$ flows through the current mirror 80 and the inverting input terminal is connected to the supply voltage $V_{CC}$ when the line current $I_L$ charges the $V_{CC}$ bypass capacitor 66.

The DC output voltage $V_{OUT}$ 26 is fed back to the controller 20 via a $V_{OUT}$ pin 48, as shown, for use in setting, or programming the output voltage level and in setting the discharge rate of the timing capacitor 64 in accordance with the control algorithm. More particularly, a resistor 104, connected between the $V_{OUT}$ pin 48 and a $T_{OFF}$ pin 52, sets the discharge rate of the timing capacitor 64, as will be discussed. Additional circuitry for setting the discharge rate of timing capacitor 64 includes a current mirror 108, including FETs 110 and 112.

More particularly, FET 110 has a drain terminal 110a adapted for connecting to the timing capacitor 64 via $C_T$ pin 56, a gate terminal 110b connected to a gate terminal 112b of FET 112, and a source terminal 110c connected to ground. The FET 112 has a drain terminal 112a connected to pin 52 and to the gate terminal 112b, and a source terminal 112c connected to ground, as shown. A switch 116 is positioned between $C_T$ pin 56 and the drain terminal 110a of FET 110. Switch 116 is in a first, open position 116a when the line current $I_L$ flows through current mirror 80 and the converter switch Q1 is closed and is in a second, closed position 116b when the line current charges $V_{CC}$ bypass capacitor 66 and the converter switch Q1 is open to allow the timing capacitor 64 to discharge through FET 110.

In operation, a current $I_O$ flows through resistor 104 and into the $T_{OFF}$ pin 52 of the IC 20 to set the level of the discharge current $I_{DCHG}$ for the timing capacitor 64. More particularly, the current $I_O$ through resistor 104 flows through FET 112 of current mirror 108. A proportional current flows through FET 110 of current mirror 108 from the timing capacitor 64 when switch 116 is in the closed position 116b.

A switched current bootstrap circuit 120 is connected between the $V_{CC}$ pin 50 and the $V_{OUT}$ pin 48 of the controller 20. The circuit 120 includes a clamp for preventing the supply voltage $V_{CC}$ from exceeding a predetermined clamp level, such as 9.0 volts, and a switched current source for limiting a bootstrap current provided by the DC output voltage $V_{OUT}$ 26 to the supply voltage capacitor 66, as described below in conjunction with FIG. 3. With this arrangement, wasted power that would otherwise be shunted by the clamp to ground is minimized.

The output voltage level $V_{OUT}$ of converter 10 is programmable via an adjustment (ADJ) pin 54, the $V_{OUT}$ pin 52, an internal resistor network including resistors 122, 124, and 130, an amplifier 134 and a diode 136. The resistor network and the voltage (if any) applied to the ADJ pin 54 determine the voltage level at an inverting input terminal of amplifier 134, the non-inverting input terminal of which receives a reference voltage, such as 2.5 volts. An output terminal of the amplifier 134 is connected to the cathode of diode 136, the anode of which is connected to the drain terminal 112a of FET 112, as shown.

In operation, the ADJ pin 54 is left disconnected, or floating, to select a DC output voltage level of twelve volts. Under these circumstances, the voltage divider including resistors 122 and 124 sets the voltage at the non-inverting amplifier input to 2.5 volts when the output voltage $V_{OUT}$ is at 12.0 volts. More particularly, a portion of the current $I_O$ is diverted into the output terminal of amplifier 134 as necessary to cause the output voltage $V_{OUT}$ to be at twelve volts.

In applications were an eighteen volt DC output voltage $V_{OUT}$ 26 is desired, the ADJ pin 54 is grounded, thereby modifying the resistor network by providing resistor 130 in parallel with resistor 124. With this arrangement, the voltage at the inverting input terminal of the amplifier 134 is at 2.5 volts when the output voltage $V_{OUT}$ is at 18.0 volts.

The controller 20 can be programmed to provide DC output voltage levels other than twelve volts or eighteen volts by connecting an external resistor divider (not shown) between the $V_{OUT}$ pin 48, the ADJ pin 54 and the ground pin 44. Preferably, such an external resistor divider has a lower impedance than the internal divider.

The control circuitry 70 includes a $V_{CC}$ undervoltage lockout feature, whereby the switching transistor Q1 is kept off, or open, until the supply voltage $V_{CC}$ rises to a predetermined level, such as 8.4 volts. To this end, a $V_{CC}$ comparator 140 is provided having an inverting input terminal connected to $V_{CC}$, a non-inverting input terminal receiving a reference voltage equal to the predetermined level, and an output terminal providing a $V_{CC}$ detection control signal $V_{VCC}$.

The controller 20 provides the drive signal $V_D$ at pin 46, for further coupling to the gate terminal of switching transistor Q1. More particularly, the drive signal $V_D$ is provided at an output terminal of a buffer 144, the input terminal of which receives an output signal from a flip-flop 148, as shown. Flip-flop 148 receives a set input on signal line 150 from set comparator 152 and a first reset input on signal line 154 from reset comparator 156. Second and third reset signals $V_{VCC}$ and $V_{LD}$ are provided to the flip-flop 148 from the $V_{CC}$ undervoltage comparator 140 and the line voltage detector 60, respectively.

A resistor divider including resistors 158, 160 and 162 provides reference voltages to the non-inverting input terminal of set comparator 152 and to the inverting input terminal of reset comparator 156. The inverting input terminal of set comparator 152 and the non-inverting input terminal of the reset comparator 156 receive the voltage across the timing capacitor 64. A logic high signal on the set input line 150 to flip-flop 148 causes the drive signal $V_D$ to go high to turn on FET Q1; whereas, a logic high signal on the reset signal line 154, or on either of the second and third reset lines $V_{VCC}$ or $V_{LD}$, causes the drive signal $V_D$ to go low to turn off FET Q1.

In operation, the $V_{CC}$ bypass capacitor 66 is initially charged by positioning switch 62 to connect terminals 62a and 62b, as described above. Although initially the inverting input terminal of set comparator 152 will be at a voltage level lower than the reference voltage at the non-inverting input, the undervoltage lockout signal $V_{VCC}$ prevents the drive signal $V_D$ from going high to turn on switch Q1 until the supply voltage $V_{CC}$ reaches 8.4 volts in order to ensure sufficient gate drive voltage for switch Q1. Once $V_{CC}$ reaches 8.4 volts, the charge and discharge times of the timing capacitor 64 (and thus, also the on and off time of switch Q1, respectively) are a function of the voltages at the input terminals of the set and reset comparators 152, 156, respectively. For example, the set signal 150 will be high, thereby closing switch Q1, until the voltage across capacitor 64 exceeds the reset comparator threshold voltage at the inverting input terminal of comparator 156. At that time, the switch Q1 is opened, switch 62 is toggled to connect terminals 62a and 62b so that the line current $I_L$ charges the $V_{CC}$ bypass capacitor 66, and switch 116 is closed to permit the timing capacitor 64 to discharge through FET 110. Once the timing capacitor voltage falls below the threshold level at the non-inverting input terminal of comparator 152, the switch Q1 is closed, the line current $I_L$ flows through current mirror 80 and switch 116 opens to ensure that the timing capacitor 64 is charged by the line current $I_L$ thereby repeating the cycle.

Considering the operation of the line voltage detector 60, the comparator 94 compares the voltage $V_R$ across the sense resistor 88 and diode 92 to a reference voltage, such as 1.25 volts. In the case where the line voltage 24 falls below a predetermined level, corresponding to the voltage $V_R$ falling below 1.25 volts, the output signal of the comparator 94 transitions to a logic high level. A logic high output of comparator 94 causes the npn transistor 96 to turn on and discharge capacitor 100. Once capacitor 100 is discharged, the output signal $V_{LD}$ of inverter 102 goes high and causes the drive signal $V_D$ to reset.

The reset of signal $V_D$ causes switch 62 to toggle to connect terminals 62a and 62b and additionally, causes switch 90 to toggle to connect terminals 90a and 90c. With this arrangement, the output signal of comparator 94 transitions to a logic low level, thereby turning off transistor 96. This arrangement permits capacitor 100 to be charged by current source 98. The time constant associated with charging capacitor 100 presents a delay in releasing the drive signal $V_D$, such as approximately 0.5 milliseconds. This delay prevents the switching of FET Q1 at an excessive frequency as a result of repeated line voltage fault detection (i.e., resetting the drive signal $V_D$), setting of the drive signal $V_D$, and subsequent line voltage fault detection. That is, once a line voltage fault is detected and the drive signal $V_D$ is reset by reset signal $V_{LD}$, the switch Q1 opens and causes switch 62 to toggle to connect terminals 62a and 62b. Timing capacitor 64 discharges promptly from a level much less than the reset threshold since the capacitor 64 was not permitted to complete its charge due to the detection of a low line condition. Switch Q1 sets quickly and the line voltage is sensed again at a faster rate than desired.

Figure 3:
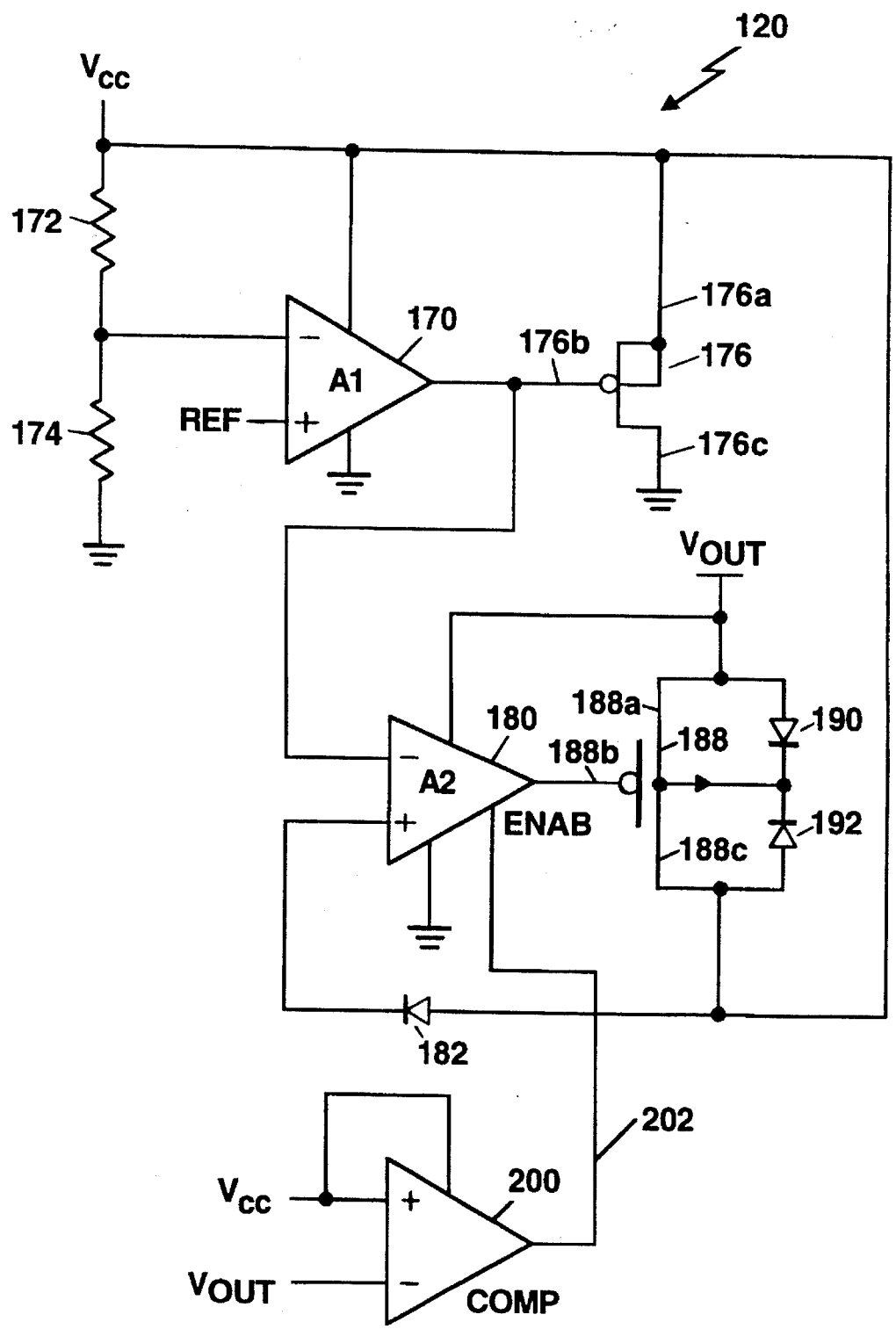
FIG. 3 is a schematic of the switched current bootstrap circuit of FIG. 2.

Referring also to FIG. 3, the switched current bootstrap circuit 120 is shown to be connected between $V_{CC}$ and $V_{OUT}$. Recall that the circuit 120 includes a clamping function and a limited current bootstrap function by which a limited current from the DC output $V_{OUT}$ is supplied to the supply voltage $V_{CC}$ when $V_{CC}$ is less than $V_{OUT}$. More particularly, the bootstrap current is limited as a function of the current shunted to ground by the clamp, so as to minimize unnecessary power dissipation.

The clamping functionality is provided by an amplifier 170, a resistor divider including resistors 172 and 174, and a PMOS FET 176. The resistor divider is connected between $V_{CC}$ and ground and establishes a voltage proportional to the supply voltage $V_{CC}$ at the inverting input terminal of the amplifier 170. A reference voltage is applied to the non-inverting input terminal of the amplifier 170. The FET 176 has a source terminal 176a connected to $V_{CC}$, a gate terminal 176b connected to the output terminal of the amplifier 170 and a drain terminal 176c connected to ground.

In operation, as the supply voltage $V_{CC}$ falls to a predetermined level, the voltage at the inverting input terminal of the amplifier 170 falls below the reference voltage at the non-inverting input terminal, causing the voltage at the amplifier output terminal to rise. This rising amplifier output voltage causes FET 176 to begin to turn off.

As the supply voltage $V_{CC}$ increases, the inverting input terminal to the amplifier 170 rises above the reference voltage, thereby causing the amplifier output signal to decrease and turn on the PMOS FET 176. As FET 176 turns on, current from supply voltage $V_{CC}$ is diverted through the FET 176 to ground, thereby causing $V_{CC}$ to fall again. In this way, the level of the supply voltage $V_{CC}$ is clamped to a predetermined level set by resistors 172, 174.

The switched current source portion of the circuit 120 includes circuitry for sensing the current through the clamp FET 176 by sensing the voltage at the gate terminal 176b of FET 176, and controls a bootstrap current flow from the output voltage $V_{OUT}$ to the supply voltage $V_{CC}$ accordingly. To this end, the switched current source includes an amplifier 180, a diode 182, a PMOS FET 188 having a pair of back-to-back body diodes 190, 192, and a comparator 200.

The FET 188 has a first terminal 188a connected to the output voltage $V_{OUT}$, a second, gate terminal 188b connected to the output terminal of the amplifier 180, and a third terminal 188c connected to $V_{CC}$. The body diode 190 of FET 188 has an anode connected to the output voltage $V_{OUT}$ 26 and a cathode connected to the N-well of the PMOS FET 188 and to a cathode of body diode 192. The anode of diode 192 is connected to $V_{CC}$, as shown. When the output voltage $V_{OUT}$ 26 is greater than $V_{CC}$, the source of FET 188 is provided by terminal 188a and the drain of FET 188 is provided by terminal 188c. Whereas, when the output voltage $V_{OUT}$ 26 is less than $V_{CC}$, the source of FET 188 is provided by terminal 188c and the drain of FET 188 is provided by terminal 188a.

Amplifier 180 has an inverting input terminal connected to the gate terminal 176b of FET 176 and a non-inverting terminal connected to the cathode of a diode 182, the anode of which is connected to $V_{CC}$. Thus, amplifier 180 senses the difference between the voltage applied to the gate terminal 176b of FET 176 and $V_{CC}$ minus one diode drop. The amplifier output controls the conduction of FET 188 to permit a limited bootstrap current to be supplied from $V_{OUT}$ to $V_{CC}$ only when the level of $V_{OUT}$ is greater than $V_{CC}$.

Comparator 200 enables and disables the switched current source amplifier 180, so that the amplifier 180 is enabled when the output voltage $V_{OUT}$ is greater than the supply voltage $V_{CC}$. Alternatively, if the output voltage $V_{OUT}$ 26 is less than the supply voltage $V_{CC}$, then the switched current source is disabled by forcing FET 188 to turn off, thereby preventing the bootstrap current from being supplied to $V_{CC}$. To this end, comparator 200 has a non-inverting input terminal to which the supply voltage $V_{CC}$ is applied and an inverting input terminal to which the output voltage $V_{OUT}$ 26 is applied. The comparator 200 is powered by the $V_{CC}$ supply so that, when $V_{CC}$ is greater than the output voltage $V_{OUT}$ 26, the comparator output signal on line 202 (i.e., the switched current source enable signal) is at $V_{CC}$; whereas, when $V_{CC}$ is less than the output voltage $V_{OUT}$ 26, the comparator output signal is at ground. A high level, of $V_{CC}$, on the enable line 202 forces the output signal of amplifier 180 to $V_{CC}$ which, in turn causes PMOS FET 188 to turn off and prevent current from flowing from $V_{CC}$ to the output $V_{OUT}$. A low level on the enable line 202 on the other hand "releases" the amplifier 180, thereby permitting the output signal of amplifier 180 to vary in accordance with the inputs thereto and to limit the bootstrap current supplied from the output $V_{OUT}$ to $V_{CC}$ accordingly.

In operation, consider first the case where the output voltage $V_{OUT}$ 26 is less than the supply voltage $V_{CC}$. In this case, the output signal of comparator 200 is at $V_{CC}$. This comparator output signal forces the output signal of amplifier 180 to be at $V_{CC}$. Since the output voltage $V_{OUT}$ 26 is less than $V_{CC}$, the source of FET 188 is provided by terminal 188c and the drain of FET 188 is provided by terminal 188a. Thus, since the voltage at terminals 188b (gate) and 188c (source) are both equal to $V_{CC}$, FET 188 is prevented from conducting current. In this way, the non-conduction of FET 188 prevents the flow of current from $V_{CC}$ to $V_{OUT}$ when $V_{OUT}$ is less than $V_{CC}$ so as to prevent $V_{CC}$ from powering $V_{OUT}$ during start up and under short circuited output conditions.

Consider next the case where the output voltage $V_{OUT}$ 26 is greater than the supply voltage $V_{CC}$. In this case, terminal 188a of FET 188 provides the source terminal and terminal 188c provides the drain of FET 188 and the output signal 202 of comparator 200 is at a logic low level, or ground. A logic low enable signal serves to enable, or release the output of amplifier 180, permitting the amplifier output signal to vary in accordance with the voltages at the inverting and non-inverting input terminals of the amplifier 180.

The switched current source of the circuit 120 ensures that the bootstrap current flow from $V_{OUT}$ to $V_{CC}$ is provided only when the supply voltage is below a predetermined level, indicating that the bootstrap current is necessary to maintain the $V_{CC}$ voltage on the bypass capacitor 66 (FIG. 2). To this end, the switched current source limits the flow of current from the output $V_{OUT}$ to $V_{CC}$ in accordance with the current shunted to ground by the clamping FET 176.

As the supply voltage $V_{CC}$ decreases, the output signal of amplifier 170 increases, thereby increasing the voltage at the gate terminal 176b of FET 176 and causing the FET 176 to turn off. As the voltage at gate 176b increases, the output of switched current source amplifier 180 decreases. Once the output of amplifier 180 decreases to a threshold drop below $V_{OUT}$, FET 188 turns on and permits current flow from $V_{OUT}$ to $V_{CC}$ through FET 188.

On the other hand, as $V_{CC}$ increases, the output of amplifier 170 decreases, causing the voltage at the gate terminal 176b of FET 176 to decrease and FET 176 to turn on. With FET 176 on, $V_{CC}$ is being clamped as current is shunted from $V_{CC}$ to ground. Under this condition, it is desirable to prevent the bootstrap current from flowing from the output voltage $V_{OUT}$ 26 to the supply voltage $V_{CC}$, since such current is not needed.

As the voltage at the inverting input terminal of amplifier 180 decreases to less than one diode drop below $V_{CC}$, the output signal of amplifier 180 increases toward $V_{OUT}$, thereby reducing the conduction of FET 188 until the amplifier output signal is within a threshold drop of the positive rail $V_{OUT}$, causing FET 188 to turn off. In this way, the current flow from $V_{OUT}$ to $V_{CC}$ is limited, and eventually terminates, as more current is shunted by FET 176. Thus, with this arrangement, the conduction of FET 188 which controls the bootstrap current flow from $V_{OUT}$ to $V_{CC}$, limits the bootstrap current as a function of the current through the clamp FET 176, so as to avoid unnecessary power dissipation.

Having described the preferred embodiments, those skilled in the art will realize that many variations are possible which will still be within the scope and spirit of the claimed invention. Therefore, it is the intention to limit the invention only as indicated by the scope of the claims.

I claim:

1. In an integrated off-line controller circuit for providing a drive signal for controlling a switching device of a switching converter which converts a line voltage having an associated line current into a regulated DC output voltage, a circuit comprising:

a control circuit responsive to a first portion of said line current for generating said drive signal;

a sense resistor responsive to a second portion of said line current for establishing a voltage proportional to said line voltage; and a comparator having a first input terminal receiving said proportional voltage and a second input terminal receiving a reference voltage, said comparator having an output terminal at which an output signal is provided, said output signal being in a first logic state when said line voltage is greater than a predetermined level and being in a second logic state when said line voltage is less than said predetermined level, wherein said output signal is coupled to said control circuit for inhibiting said drive signal when said output signal is in said second logic state.

2. The circuit recited in claim 1 further comprising a current mirror having a first leg carrying said first portion of said line current to said control circuit and a second leg carrying said second portion of said line current to said sense resistor.

3. The circuit recited in claim 2 wherein said first leg of said current mirror comprises a first PMOS transistor having a source terminal connectable to said line voltage through a resistor, a drain terminal coupled to said control circuit, and a gate terminal connected to said drain terminal and wherein said second leg of said current mirror comprises a second PMOS transistor having a source terminal connected to said source terminal of said first PMOS transistor, a drain terminal connected to said sense resistor and a gate terminal connected to said gate terminal of said first PMOS transistor, wherein said control circuit comprises a timing capacitor establishing a frequency of said drive signal.

4. The circuit recited in claim 1 further comprising a switch connected in series between said sense resistor and said first input terminal of said comparator, said switch having a first position in which said sense resistor is connected to said first input terminal of said comparator and a second position in which said first input terminal of said comparator is connected to a supply voltage.

5. The circuit recited in claim 1 further comprising a delay circuit connected to said output terminal of said comparator for delaying a transition of said comparator output signal from said second logic state to said first logic state.

6. The circuit recited in claim 1 further comprising a diode connected in series between said sense resistor and ground, said diode having an anode connected to said sense resistor and a cathode connected to ground.

7. A line voltage detector for use in an integrated off-line controller circuit receiving a line current associated with a line voltage and providing a drive signal for a switching device of an off-line converter, said converter converting said line voltage into a DC output voltage, said line voltage detector comprising:

a current mirror having a first leg connectable to said line voltage through a current limiting resistor, said first leg carrying a first current proportional to said line voltage and a second leg carrying a second current proportional to said line voltage;

a sense resistor in series with said second leg of said current mirror, said sense resistor establishing a voltage proportional to said line voltage;

a comparator having a first input terminal coupled to said sense resistor and second input terminal coupled to a reference voltage, said comparator having an output terminal at which an output signal indicative of whether said line voltage is greater or less than a predetermined voltage level is provided; and a delay circuit connected to said output terminal of said comparator for delaying a transition of said comparator output signal from a first state indicative of said line voltage being less than said predetermined voltage level to a second state indicative of said line voltage being greater than said predetermined voltage level.

8. The line voltage detector recited in claim 7 wherein said first leg of said current mirror comprises a first PMOS transistor having a source terminal adapted for connection to said current limiting resistor, a drain terminal adapted for connection to a timing capacitor of said converter, and a gate terminal connected to said drain terminal and wherein said second leg of said current mirror comprises a second PMOS transistor having a source terminal connected to said source terminal of said first PMOS transistor, a drain terminal connected to said sense resistor and a gate terminal connected to said gate terminal of said first PMOS transistor.

9. The line voltage detector recited in claim 7 further comprising a diode in series with said sense resistor for compensating for temperature variation on said sense resistor.

10. A method for detecting a DC line voltage in an integrated off-line controller circuit providing a drive signal for controlling a switching device of an off-line converter which converts said DC line voltage to a DC output voltage, comprising the steps of:

providing a current proportional to said DC line voltage to said controller circuit;

mirroring said proportional current with a current mirror to provide a mirrored current;

establishing a sense voltage across a resistor with said mirrored current, said sense voltage being proportional to said DC line voltage;

comparing said sense voltage to a reference voltage to provide a control signal at a first logic level when said DC line voltage is below a predetermined level and at a second logic level when said DC line voltage is above said predetermined level; and inhibiting said drive signal in response to said control signal being at said first logic level.

11. The method recited in claim 10 further comprising the step of delaying said control signal from transitioning from said first logic level to said second logic level.

12. The method recited in claim 10 further comprising the step of compensating for temperature variations on said sense resistor.

* * * * *